United States Patent [19]

Knauer

[11] 4,142,109
[45] Feb. 27, 1979

[54] PROCESS FOR OPERATING A CHARGE-COUPLED ARRANGEMENT IN ACCORDANCE WITH THE CHARGE-COUPLED DEVICE PRINCIPLE

[75] Inventor: Karl Knauer, Gauting, Fed. Rep. of Germany

[73] Assignee: Siemens Aktiengesellschaft, Berlin & Munich, Fed. Rep. of Germany

[21] Appl. No.: 641,818

[22] Filed: Dec. 17, 1975

[30] Foreign Application Priority Data

Jan. 11, 1975 [DE] Fed. Rep. of Germany ....... 2500909

[51] Int. Cl.² .......................................... H01L 29/66
[52] U.S. Cl. .................... 307/221 D; 357/24
[58] Field of Search ............. 357/24; 307/221 D, 304

[56] References Cited

U.S. PATENT DOCUMENTS

| | | | |
|---|---|---|---|
| 3,651,349 | 3/1972 | Kahng et al. ........................ | 307/304 |
| 3,796,932 | 3/1974 | Amelio et al. ...................... | 357/24 |
| 3,852,799 | 12/1974 | Walden .................................. | 357/24 |

OTHER PUBLICATIONS

Proceedings by Naval Electronics Lab Center P-270, Sep. 18-20, 9/1973.

*Primary Examiner*—John S. Heyman
*Attorney, Agent, or Firm*—Hill, Gross, Simpson, Van Santen, Steadman, Chiara & Simpson

[57] ABSTRACT

A buried channel charge coupled device (BCCD) is operated by an improved process in a two-phase operation. The device includes a buried channel in a semiconductor substrate below an insulating layer on a surface of the substrate and below the electrodes of the device. The electrodes are divided into first and second electrodes with the first electrodes spaced apart in a first level of the insulating layer and electrically insulated from the semiconductor substrate and the second electrodes spaced apart and carried by the insulating layer in a second level and arranged over the interspaces between the first electrodes. Each of the second electrodes is electrically connected to an adjacent first electrode. The device is operated in a two-phase manner and the operation is improved by the provision of a bias voltage which is connected either to all of the electrodes or to the substrate, the bias voltage effecting a potential difference between the electrodes and the substrate which is either greater than or less than a predetermined magnitude so as to effect charge shifting in one direction or the other, respectively.

2 Claims, 5 Drawing Figures

PROCESS FOR OPERATING A CHARGE-COUPLED ARRANGEMENT IN ACCORDANCE WITH THE CHARGE-COUPLED DEVICE PRINCIPLE

BACKGROUND OF THE INVENTION

1. Field of the Invention

This invention relates to a process for operating a charge coupled arrangement in a two-phase operation, in which an insulating layer is provided on a substrate of semiconductor material and contains electrodes at a first level spaced apart therein and insulated from the semiconductor substrate, and second electrodes at a second level arranged above the interspaces between the electrodes of the first level and electrically insulated from the electrodes of the first level, and wherein each electrode of the second level is electrically connected to and adjacent electrode of the first level and a zone, doped opposite to that of the semiconductor substrate, is provided in the substrate beneath the electrodes and beneath the insulating layer.

2. Description of the Prior Art

Charge-coupled arrangements are well known in the art. For example, the publication "The new concept for memory and imaging: charge coupling" by Laurence Altman, appearing in the June 21, 1971 issue of the periodical *Electronics* at Pages 50 to 58, describes a SCCD charge-coupled arrangement (surface charge-coupled device) for two-phase operation in an aluminum-silicon-gate technique. In order to change the transmission direction, it is necessary to change the pulse program for the pulse train lines. However, this means that in each case each second aluminum electrode and each second silicon electrode must be connected to an individual drive electrode and that these four lines must be accessible from the exterior of the device. In the event that adjacent aluminum and silicon electrodes are permanently connected, it is not possible, however, to change direction in this manner.

The "Bell System Technical Journal", Vol. 54, September 1972, No. 7, Pages 1635-1640 describes a BCCD (buried channel charge-coupled device) arrangement. In such an arrangement, below the electrodes between the semiconductor substrate and the insulating layer is arranged a zone which is oppositely doped in respect of the doping of the substrate.

SUMMARY OF THE INVENTION

The object of the invention is to provide a process for the operation of a BCCD arrangement for two-phase operation, with the aid of which a change of direction is possible.

The foregoing object is realized by a process, such as already mentioned above, for the operation of a charge-coupled arrangement, which process is characterized, according to the invention, in that a bias voltage is applied either to the electrodes or to the substrate so as to cause a potential between the electrodes and the substrate. With this potential greater than a predetermined magnitude, shifting occurs in one direction and with the voltage less than the predetermined magnitude, shifting occurs in the opposite direction.

An essential advantage of the invention resides in the fact that the transmission direction can be reversed merely by altering a bias voltage.

Advantageously, the invention can be used in the case of CCD storage modules in which the system requires a shift in both directions.

The invention is also of significance in respect of its use in CCD fields in which, advantageously, with the aid of the invention, four transmission directions, instead of two, can be established.

BRIEF DESCRIPTION OF THE DRAWINGS

Other objects, features and advantages of the invention, its organization, construction and operation will be best understood from the following detailed description taken in conjunction with the accompanying drawings, on which.

DESCRIPTION OF THE PREFERRED EMBODIMENTS

Figure 1:
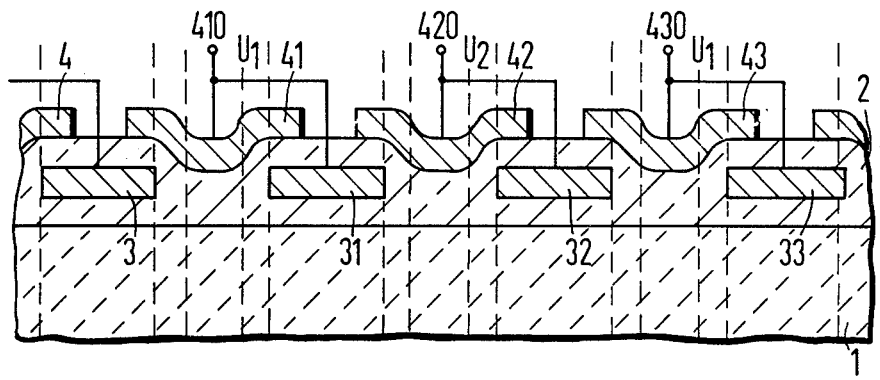
FIG. 1 is a schematic cross-sectional illustration of a known SCCD arrangement for two-phase operation.

The known SCCD charge-coupled arrangement illustrated in FIG. 1, corresponding to two-phase operation, is arranged on a semiconductor substrate 1, for example a p silicon substrate 1. As illustrated in FIG. 1, a plurality of first electrodes 3, 31, 32 and 33 are arranged at a first level on the semiconductor substrate 1, within an electrically insulating layer 2, which preferably consists of silicon dioxide. The first electrodes of the first level are electrically insulated from the semiconductor substrate by the insulating layer 2 which is located between the electrodes 3, 31, 32 and 33 and the substrate 1. A plurality of second electrodes 4, 41, 42 and 43 are arranged at a second level on the electrically insulating layer 2, in the manner illustrated in FIG. 1, above the interspaces between the electrodes 3, 31, 32 and 33 of the first level. These second electrodes of the second level are insulated from the electrodes 3, 31, 32 and 33 of the first level by the electrically insulating layer 2, in the manner illustrated in FIG. 1. One electrode of the second level and one electrode of the first level are each electrically connected to one another as illustrated on the drawing. For example, the electrode 41 of the second level is electrically connected to the electrode 31 of the first level at the point 410. Correspondingly, the electrodes 42 and 32 are connected at the point 420 and the electrodes 43 and 33 are connected at the point 430. Two interconnected electrodes, in each case, form a charge-coupling stage.

Preferably, the electrodes of the second level consist of aluminum, whereas the electrodes of the first level consists of silicon.

Figure 2:
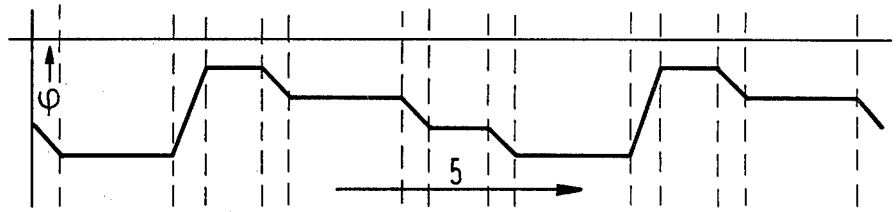
FIG. 2 is a graphic illustration of the potential distribution for the arrangement shown in FIG. 1.

Turning now to FIG. 2, the potential course for operation during a charge-coupling process is illustrated. Here, it has been assumed that the terminals 410 and 430 are connected to a potential $U_1$, and the terminal 420 is connected to a potential $U_2$, where the potential $U_2$ is absolutely greater than the potential $U_1$, and that the substrate 1 is preferably connected to ground potential. The transmission direction is established by the permanent connection, described above, of the aluminum electrodes of the second level to the silicon electrodes of the first level. The charge is always stored in the absolutely deeper potential wells. Therefore, in the case of a potential course illustrated in FIG. 2, the charge which is to be coupled would be stored under the electrode 32. The direction of the charge coupling is indicated by an arrow 5.

Figure 3:
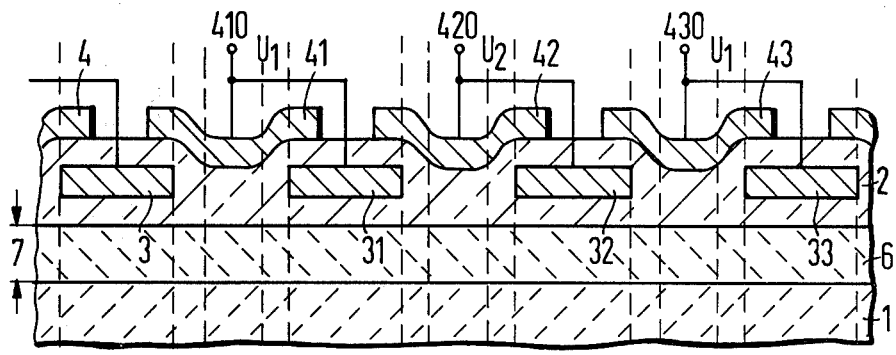
FIG. 3 is a schematic cross-sectional view through a known BCCD charge-coupled arrangement.

As represented in FIG. 3, a known BCCD charge-coupled arrangement differs from the above-described SCCD charge-coupled coupled arrangement in respect of a zone 6 located beneath the electrodes of both levels and beneath the electrically insulating layer 2. The details of the arrangement in FIG. 3 which have already been described in association with FIGS. 1 and 2, bear the corresponding reference characters. The zone 6, like the substrate 1, consists of semiconductor material and is doped opposite to the substrate 1. For example, the substrate 1 consists of p-conducting silicon and the layer 6 consists of n-conducting silicon. Preferably, the p-silicon semiconductor substrate 1 is doped with approximately $N_A = 10^{15}$ cm$^{-3}$, and the doped semiconductor zone 6, produced by diffusion in the substrate 1, is doped with approximately $N_D = 10^{16}$ cm$^{-3}$. The thickness of the zone 6 is referenced 7 in FIG. 3. This thickness preferably amounts to approximately 0.5 $\mu$m to 5 $\mu$m. The thickness of the layer 2 between the electrodes of the first level and the surface of the zone 6 amounts to approximately 100 nm, and the thickness of the layer 2 between the electrodes of the second level and the surface of the zone 6 amounts to approximately 300 nm.

Figure 4:
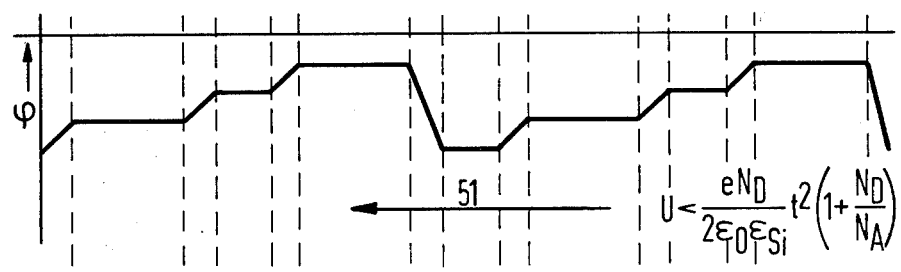
FIG. 4 is a graphic illustration of the potential courses for charge coupling in one direction in the arrangement shown in FIG. 3.
Figure 5:
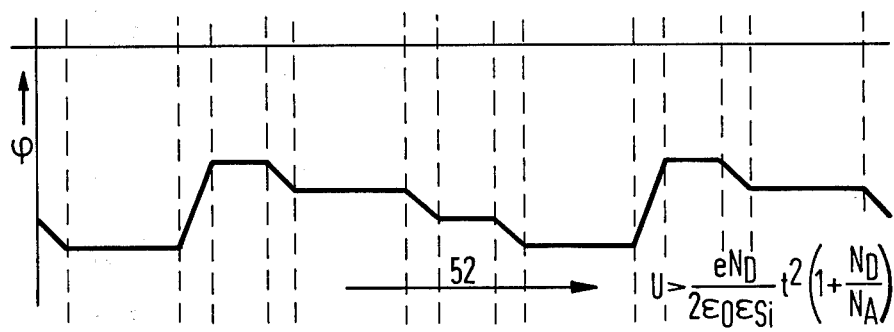
FIG. 5 is a graphic illustration of the potential courses for charge coupling in the opposite direction for the arrangement shown in FIG. 3.

According to the invention, it is possible to change the transmission direction in a BCCD arrangement by altering the potential difference U between the electrodes and the semiconductor substrate. This is illustrated in FIGS. 4 and 5. Here, U is the blocking voltage between the differently doped regions, that is between the substrate 1 and the zone 6. If the potential difference U is $$U < (eN_D/2 \, \epsilon_o \epsilon_{si}) \, d^2(1 + N_D/N_A)$$

the coupling direction represented by the arrow 51 in FIG. 4 results, and if this potential difference is $$U > (eN_D/2 \, \epsilon_o \epsilon_{si}) \, d^2(1 + N_D/N_A)$$

the coupling direction represented by the arrow 52 in FIG. 5 results. The change in the potential difference determines whether the charge coupling takes place in the buried channel (BCCD operation) or on the surface (SCCD operation). In the case of operation according to FIG. 4, thus for $$U < (eN_D/2 \, \epsilon_o \epsilon_{si}) \, d^2(1 + N_D/N_A)$$

the potential wells always lie beneath the thicker insulation layer. This means that the potential wells always lie beneath the electrodes of the second level. For the relation $|U_1| < |U_2|$ the potential wells, therefore, lie beneath the electrode 42, as can be seen from FIG. 4. For the situation illustrated in FIG. 5, thus for $$U > (eN_D/2 \, \epsilon_o \epsilon_{si}) \, d^2(1 + N_D/N_A)$$

the potential wells always lie beneath the thinner insulation layer 2, thus below the electrodes of the first level. Thus, for the relation $|U_1| < |U_2|$ these potential wells lie beneath the electrode 32, as can be seen from FIG. 5. In the foregoing relationships:

e = an electron charge,
$N_D$ = the concentration of the donors in the layer 6,
$N_A$ = the concentration of the acceptors in the substrate 1,
d = the thickness of the layer 6,
$\epsilon_o$ = the dielectric constant of a vacuum, and
$\epsilon_{si}$ = the dielectric constant of silicon.

In accordance with the invention, the transmission direction can therefore be changed by simply connecting a bias voltage either to all of the electrodes, or to the semiconductor substrate 1.

The present invention can be utilized for all applications in which a change in the transmission direction is required. This is the case, for example, in a first-in-last-out storage register. The information is input into the register, for example in BCCD operation, and can then, after the connection of a bias voltage, be read out in SCCD operation with precisely the same pulse train. Here, BCCD operation signifies that absolute potential wells exist beneath the electrodes 4, 41, 42, 43 of the second level with the thicker insulating layer between the relevant electrodes and the layer 6, and SCCD operation signifies that absolute potential wells exist beneath the electrodes 3, 31, 32, 33 of the first level with the thinner insulating layer between these electrodes and the layer 6, across which potential wells the charge is, in each case, stored.

The invention can also be used in two-dimensional matrices, such as are described, for example, in the publication of C. H. Sequin, "Two-Dimensional Charge-Transfer Arrays", IEEE Journal of SSC, Vol. SC-9, No. 3, June 1974, Pages 134–142. These two-dimensional matrices are two-dimensional arrays in which the information can be coupled in two directions. If BCCD circuits are used and operate in accordance with the process of the present invention, the charge can not only be coupled in two directions, but can advantageously also be coupled in four directions by means of the simple additional stage of another substrate bias voltage.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. In a process for operating a charge-coupled arrangement for two-phase operation in accordance with the charge-coupled principle, the charge-coupled arrangement comprising a substrate of doped silicon semiconductor material carrying an insulating layer, a plurality of first electrodes spaced apart in a first level in the insulating layer and insulated from the substrate, a plurality of second electrodes spaced apart and carried by the insulating layer in a second level over the interspaces of and electrically insulated from the first electrodes, each of the second electrodes electrically connected to an adjacent first electrode, and a zone in the substrate beneath the electrodes and beneath the insulating layer which is doped opposite to the doping of the substrate, for operating in one of two determinate directions the improvement comprising the step of:

applying a bias voltage to all of the first electrodes and to all of the second electrodes such that the potential between the electrodes and the semiconductor substrate is greater than $$(eN_D/2\ \epsilon_o\epsilon_{si})\ d^2(1 + N_D/N_A)$$

for operation in one direction and less than $$(eN_D/2\ \epsilon_o\epsilon_{si})\ d^2(1 + N_D/N_A)$$

for operation in the opposite direction, where
e is an electron charge,
$N_D$ is the donor concentration in the doped zone,
$N_A$ is the acceptor concentration in the substrate,
d is the thickness of the doped zone,
$\epsilon_o$ is the dielectric constant in a vacuum, and
$\epsilon_{si}$ is the dielectric constant of silicon.

2. In a process for operating a charge-coupled arrangement for two-phase operation in accordance with the charge-coupled principle, the charge-coupled arrangement comprising a substrate of doped silicon semiconductor material carrying an insulating layer, a plurality of first electrodes spaced apart in a first level in the insulating layer and insulated from the substrate, a plurality of second electrodes spaced apart and carried by the insulating layer in a second level over the interspaces of and electrically insulated from the first electrodes, each of the second electrodes electrically connected to an adjacent first electrode, and a zone in the substrate beneath the electrodes and beneath the insulating layer which is doped opposite to the doping of the substrate, for operating in one of two determinate directions the improvement comprising the step of:
applying a bias voltage to the semiconductor substrate such that the potential between the electrodes and the semiconductor substrate is greater than $$(eN_D/2\ \epsilon_o\epsilon_{si})\ d^2(1 + N_D/N_A)$$

for operation in one direction and less than $$(eN_D/2\ \epsilon_o\epsilon_{si})\ d^2(1 + N_D/N_A)$$

for operation in the opposite direction, where
e is an electron charge,
$N_D$ is the donor concentration in the doped zone,
$N_A$ is the acceptor concentration in the substrate,
d is the thickness of the doped zone,
$\epsilon_o$ is the dielectric constant in a vacuum, and
$\epsilon_{si}$ is the dielectric constant of silicon.

* * * * *